United States Patent [19]
Ando

[11] Patent Number: 5,438,541
[45] Date of Patent: Aug. 1, 1995

[54] SEMICONDUCTOR DYNAMIC RANDOM ACCESS MEMORY CELL FREE FROM LEAKAGE BETWEEN ACCUMULATING ELECTRODE AND COUNTER ELECTRODE

[75] Inventor: Koichi Ando, Tokyo, Japan

[73] Assignee: NEC Corporation, Tokyo, Japan

[21] Appl. No.: 301,589

[22] Filed: Sep. 7, 1994

[30] Foreign Application Priority Data

Sep. 7, 1993 [JP] Japan .................................. 5-221564

[51] Int. Cl.$^6$ ............................................. G11C 13/00
[52] U.S. Cl. .................................. 365/182; 365/149; 257/57
[58] Field of Search ................... 365/182, 149; 257/57, 257/66

[56] References Cited

U.S. PATENT DOCUMENTS 5,278,428  1/1994  Yamada et al. .................... 365/182

Primary Examiner—Terrell W. Fears
Attorney, Agent, or Firm—Sughrue, Mion, Zinn, Macpeak & Seas

[57] ABSTRACT

A storage capacitor incorporate in a semiconductor dynamic random access memory cell has an accumulating electrode of p-type polysilicon electricaly conencted to an n-type drain region of an associated switching transistor, a dielectric film structure covering the accumulating electrode and a counter electrode opposed through the dielectric film structure and formed of a p-type polysilicon, and the dielectric film structure is thinner than a critical thickness for a direct tunneling current by virtue of the wide potential barrier between the dielectric film structure and the p-type polysilicon and the Fermi level of the p-type polysilicon falling into the forbidden band of the other p-type polyslicon.

7 Claims, 13 Drawing Sheets

SEMICONDUCTOR DYNAMIC RANDOM ACCESS MEMORY CELL FREE FROM LEAKAGE BETWEEN ACCUMULATING ELECTRODE AND COUNTER ELECTRODE

FIELD OF THE INVENTION

This invention relates to a semiconductor dynamic random access memory device and, more particularly, to a dynamic random access memory cell incorporated in the semiconductor dynamic random access memory device.

DESCRIPTION OF THE RELATED ART

The semiconductor dynamic random access memory device has been increased in integration density, and miniaturization of the storage capacitor supports the enhancement of the integration density. Of course, the development of the integration density does not allow the miniaturized storage capacitor to decrease the accumulated electric charge, and various approaches have been proposed. One of the approaches is a three-dimensional structure, and the trench structure and the stacked structure effectively increase the electric charge accumulated in the storage capacitor without increase of the occupation area. Another approach is a thin dielectric layer, and the dielectric film structure is equivalent to 5 nanometers of a silicon oxide film for the stacked capacitor of a 16 mega-bit semiconductor dynamic random access memory device.

Description is firstly made on a typical example of the process sequence for the dynamic random access memory device equipped with the stacked capacitor type memory cells with reference to FIG. 1A to 1D of the drawings.

The prior art process sequence starts with preparation of a p-type silicon substrate 1, and a thick field oxide layer 2 is selectively grown on the major surface of the p-type silicon substrate 1. The thick filed oxide layer 2 defines an active area in the major surface.

The active area is thermally oxidized for growing a gate oxide film 3, and a polysilicon layer is deposited over the entire surface of the structure. The polysilicon layer is patterned into a word line through lithographic techniques, and a part of the word line forms a gate electrode 4 on the thin gate oxide film 3. Using the gate electrode 4 as a mask, n-type dopant impurity is ion-implanted into the active area, and an n-type source region 5a and an n-type drain region 5b are formed in the active area in a self-aligned manner with the gate electrode 4.

An inter-level insulating layer 6 is deposited over the entire surface of the structure, and an appropriate mask layer (not shown) is formed on the inter-level insulating layer 6. The mask layer exposes an area over the n-type source region 5a. Using the mask layer, the inter-level insulating layer 6 and the thin gate oxide film 3 are partially etched away, and a contact hole 6a is formed through the inter-level insulating layer 6 and the thin gate oxide film 3 as shown in FIG. 1A.

Polysilicon is deposited over the entire surface of the structure, and n-type dopant impurity is diffused or ion-implanted into the polysilicon. The polysilicon doped with the n-type dopant impurity forms a doped polysilicon layer 7. The doped polysilicon fills the contact hole 6a, and the doped polysilicon layer 7 is held in contact with the n-type source region 5a. The resultant structure at this stage is illustrated in FIG. 1B.

In this instance, the doped polysilicon 7 is $10^{20}$ atoms/cm$^3$ in dopant concentration.

The polysilicon layer 7 is patterned through lithographic techniques into an accumulating electrode 7a, and a silicon nitride film 8 is deposited over the entire surface of the structure through a low-pressure chemical vapor deposition. The surface portion of the silicon nitride film 8 is converted into a silicon oxide film 9 through a wet oxidation, and the resultant structure at this stage is illustrated in FIG. 1C. The silicon nitride film 8 and the silicon oxide film 9 form in combination a dielectric film structure, and the dielectric film structure is equivalent in thickness to a silicon oxide film of 5 nanometers thick. The silicon oxide film is assumed to have the dielectric constant of 3.82.

Polysilicon is deposited over the entire surface of the structure though a low-pressure chemical vapor deposition, and n-type dopant impurity is introduced into the polysilicon. As a result, a doped polysilicon layer is formed on the silicon oxide film 9, and is patterned into a counter electrode 10 as shown in FIG. 1D.

Though not shown in the drawings, a second inter-level insulating layer is deposited over the entire surface of the structure, and a bit contact hole is formed through the inter-level layers. A bit line is formed on the second inter-level insulating layer, and is held in contact through the bit contact hole to the n-type drain region 5b.

The gate oxide film 3, the gate electrode 4, the n-type source region 5a, the n-type drain region 5b as a whole constitute an n-channel enhancement type switching transistor SW1, and the accumulating electrode 7a, the silicon nitride film 8, the silicon oxide film 9 and the counter electrode 10 form in combination a stacked-type storage capacitor CP1. The series combination of the n-channel enhancement type switching transistor SW1 and the stacked type storage capacitor CP1 serves as the stacked type dynamic random access memory cell.

In operation, the counter electrode 10 is applied with an intermediate voltage level as high as a half of the power voltage level Vcc, and the n-channel enhancement type switching transistor SW1 turns on for storing a data bit in the storage capacitor. The two logic levels of the stored data bit are represented by the power voltage level Vcc and the ground voltage level.

A problem is encountered in the prior art dynamic random access memory cell in that the dielectric film structure can not decrease the thickness less than the equivalent thickness of 5 nanometers. If the dielectric film structure is decreased in the equivalent thickness less than 5 nanometers, leakage current tends to flow therethrough, and the accumulated electric charge is lost in short time period.

SUMMARY OF THE INVENTION

It is therefore an important object of the present invention to provide a semiconductor dynamic random access memory cell which is free from the leakage current between an accumulating electrode and a counter electrode.

The present inventor contemplated the leakage current, and noticed that the potential barrier between the Fermi level of the n-type polysilicon and the bottom edge of the conduction band of the silicon oxide film promoted a direct tunneling current. In detail, the prior art storage capacitor CP1 created the energy structure shown in FIG. 2 in thermal equilibrium, and the band gap in the silicon oxide and the band gap of the silicon nitride were about 8 eV and 5 eV. The potential gap between the Fermi level Ef and the bottom edge Ec of the conduction band of the silicon oxide was about 3 eV, and the potential gap between the silicon oxide and the silicon nitride was about 1 eV. The dielectric film structure was equivalent to the silicon oxide film SO of 5 nanometer thick, and the energy structure shown in FIG. 2 was modulated to the energy structure shown in FIG. 3A.

When bias voltage of 1 volt was applied to the accumulating electrode 7a with respect to the counter electrode 10, the Fermi level of the n-type polysilicon for the counter electrode 10 was aligned with a certain energy level in the conduction band of the n-type polysilicon for the accumulating electrode 7a as shown in FIG. 3B, and the direct tunneling phenomenon was much liable to take place in spite of the potential gap of 3 eV between the n-type polysilicon and the silicon oxide.

On the other hand, if bias voltage of −1 volt was applied to the accumulating electrode 10 with respect to the counter electrode 7a, the Fermi level of the n-type polysilicon for the accumulating electrode 7a was aligned with a certain energy level in the conduction band of the n-type polysilicon for the counter electrode 10 as shown in FIG. 3C, and the direct tunneling phenomenon tended to take place in spite of the potential gap of 3 eV between the silicon oxide and the n-type polysilicon.

Therefore, the present inventor concluded that the combination of the n-type polysilicon layers on both sides of the silicon oxide film be avoided.

To accomplish the object, the present invention proposes to arrange the energy band structure of a storage capacitor in such a manner that the Fermi level of a semiconductor substance for at least either electrode falls within the forbidden band of a semiconductor substance for the other electrode or alternatively increase a potential barrier height between an electrode and a dielectric film structure.

In accordance with the present invention, there is provided a semiconductor dynamic random access memory cell fabricated on a semiconductor substrate, comprising: a) a switching transistor having a first impurity region formed in a surface portion of the semiconductor substrate and coupled to a signal line, and a second impurity region formed in another surface portion of the semiconductor substrate and connectable to the first impurity region; and b) a storage capacitor having an accumulating electrode electrically connected to the second impurity region in an ohmic manner, a dielectric film structure covering the accumulating electrode, and a counter electrode held in contact with the dielectric film structure in an opposing relation to the accumulating electrode, at least one of the accumulating electrode and the counter electrode having a p-type polysilicon held in contact with the dielectric film structure.

BRIEF DESCRIPTION OF THE DRAWINGS

The features and advantages of the semiconductor dynamic random access memory cell according to the present invention will be more clearly understood from the following description taken in conjunction with the accompanying drawings in which.

DESCRIPTION OF THE PREFERRED EMBODIMENTS

First Embodiment

Figure 1A:
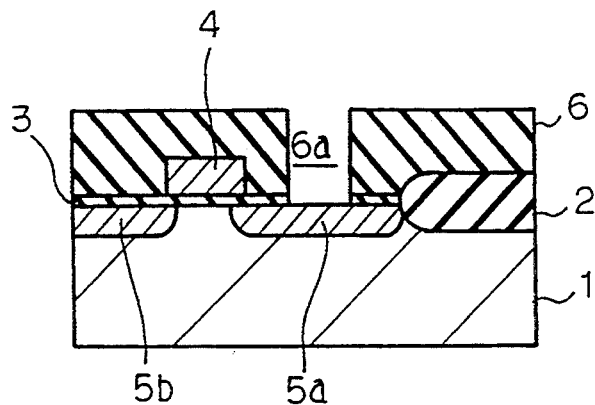
FIGS. 1A to 1D are cross sectional views showing the prior art process sequence for fabricating the stacked-type dynamic random access memory cell.
Figure 1B:
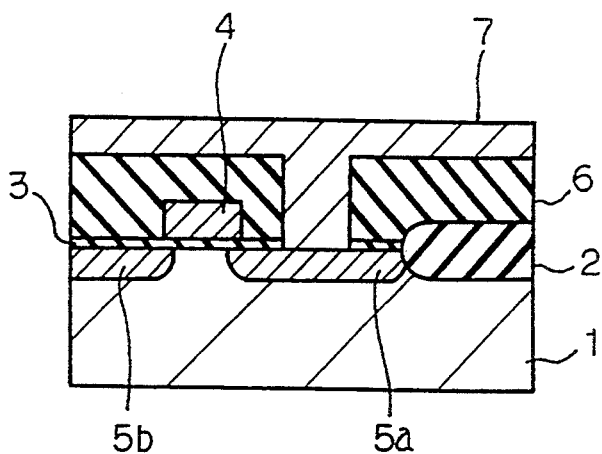
Figure 1C:
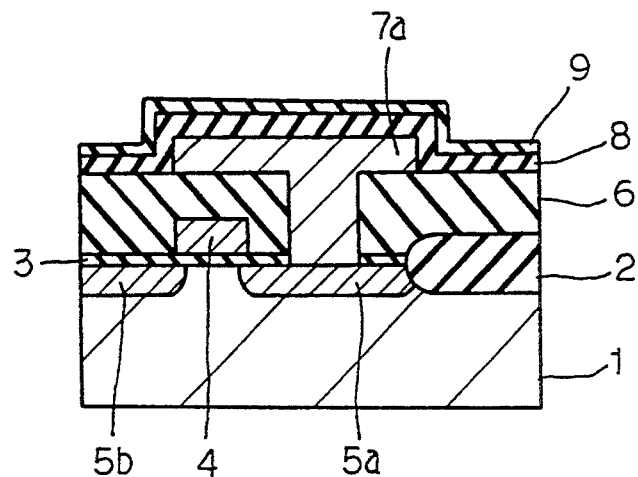
Figure 1D:
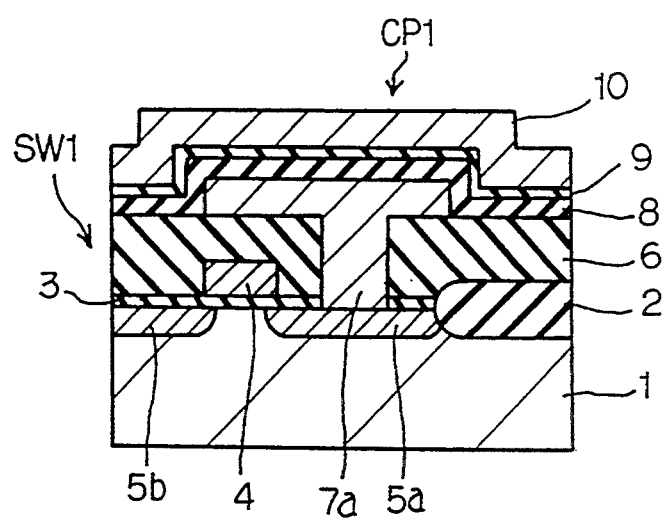
Figure 2:
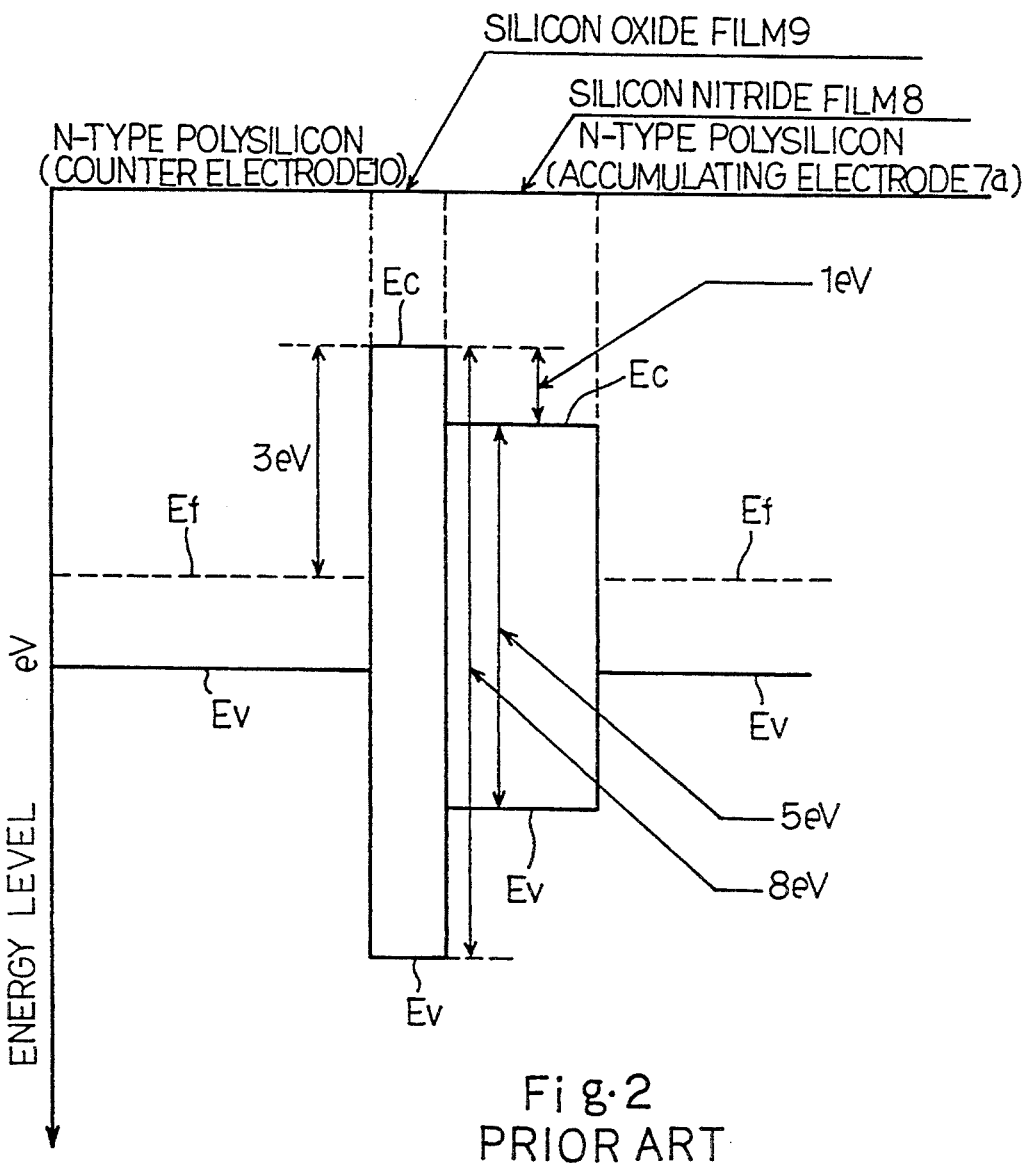
FIG. 2 is an energy band diagram showing the band structure of the prior art stacked type storage capacitor in thermal equilibrium without a bias.
Figure 3A:
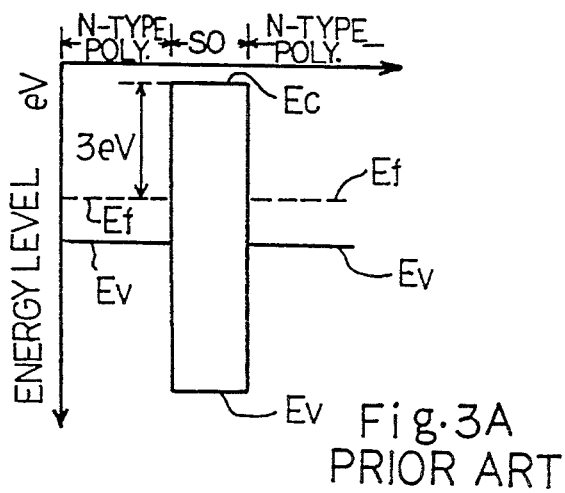
FIGS. 3A to 3C are energy band diagrams showing the band structure of the prior art stacked type storage capacitor in thermal equilibrium.
Figure 3B:
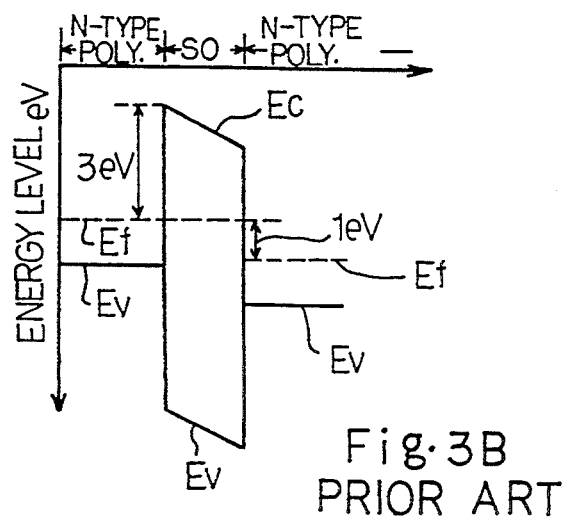
Figure 3C:
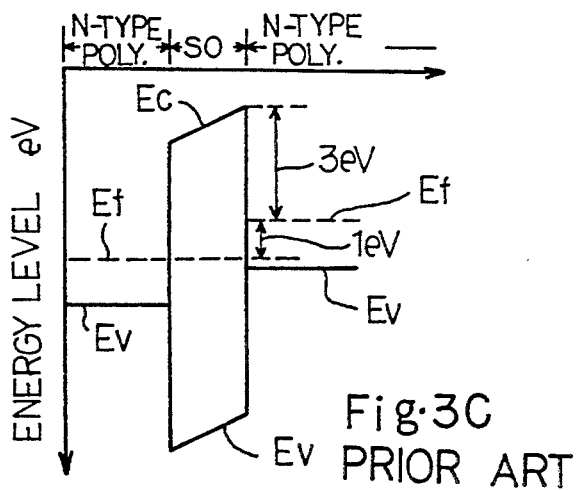
Figure 4:
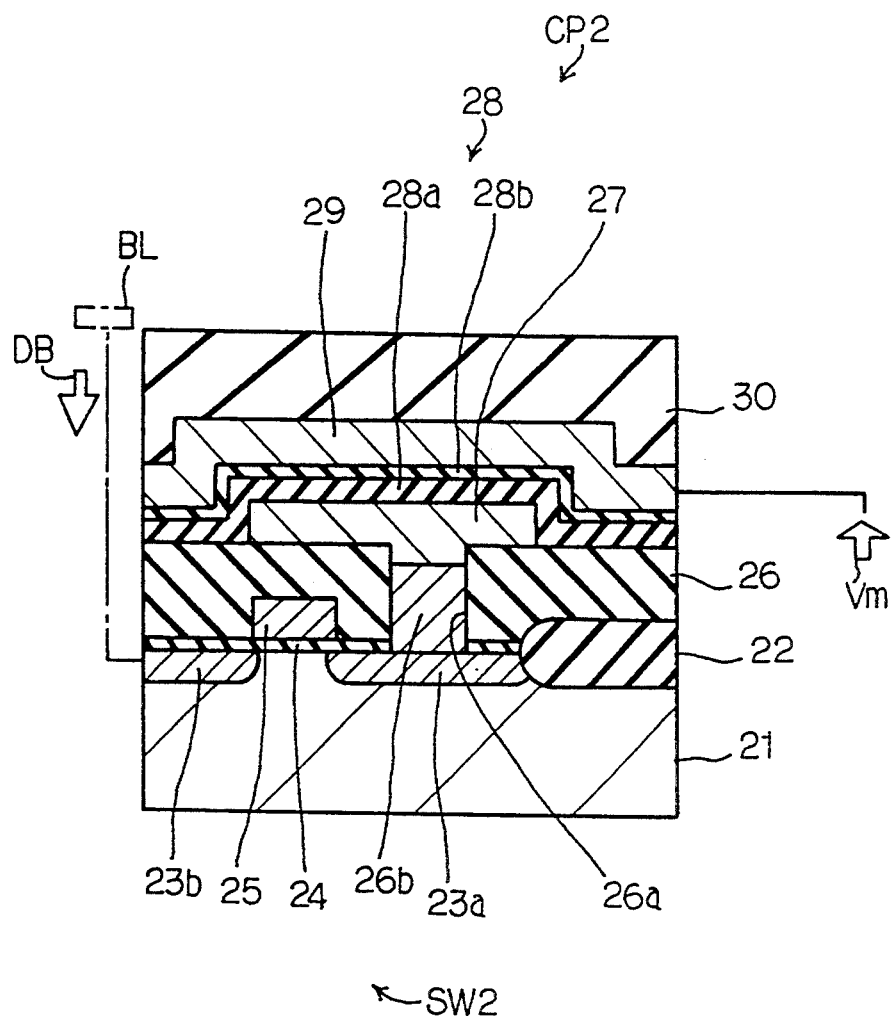
FIG. 4 is a cross sectional view showing the structure of a semiconductor dynamic random access memory cell according to the present invention.

Referring to FIG. 4 of the drawings, a semiconductor dynamic random access memory cell is fabricated on a p-type silicon substrate 21, and a thick field oxide layer 22 defines an active area in the major surface of the p-type silicon substrate 21. The active area assigned to the semiconductor dynamic random access memory cell is not wider than the active area assigned to the prior art semiconductor dynamic random access memory cell.

In the active area, an n-type source region 23a and an n-type drain region 23b are formed in the active area, and are spaced apart from each other by a channel region. The channel region is covered with a gate insulating film 24, and a gate electrode forming a part of a word line is patterned on the gate insulating film 24 in a self-aligned manner with the n-type source region. 23a and the n-type drain region 23b.

The n-type source region 23a, the n-type drain region 23b, the channel region, the gate insulating film 24 and the gate electrode 25 as a whole constitute an n-channel enhancement type switching transistor SW2.

A first inter-level insulating layer 26 covers the n-channel enhancement type switching transistor SW2 and other exposed layers, and a contact hole 26a is formed in the first inter-level insulating layer 26 for exposing a part of the n-type source region 23a. A conductive metal block 26b plugs the contact hole 26a, and an ohmic contact is formed between the n-type source region 23a and the conductive metal block 26b. In this instance, the conductive metal block 26b is formed of tungsten, molybdenum, copper, aluminum or titanium nitride.

An accumulating electrode 27 of p-type polysilicon is formed on the first inter-level insulating layer 26, and is held in contact with the conductive metal block 26b in the contact hole 26a. As a result, an ohmic contact is formed between the conductive metal block 26b and the accumulating electrode 27, and current bi-directionally flows through the ohmic contacts between the n-type source region 23a and the accumulating electrode 27.

The accumulating electrode 27 is covered with a silicon nitride film 28a which in turn is covered with a silicon oxide film 28b. The silicon nitride film 28a and the silicon oxide film 28b form in combination a dielectric film structure 28.

The dielectric film structure 28 is overlain by a counter electrode 29 of p-type polysilicon, and the counter electrode 29 is biased with an intermediate voltage level Vm. The intermediate voltage level Vm is regulated to a half of a positive power voltage level Vcc, and the positive power voltage level Vcc is about 2 volts.

The accumulating electrode 27 of the p-type polysilicon, the dielectric film structure 28 and the counter electrode 29 of the p-type polysilicon as a whole constitute a stacked type storage capacitor CP2, and the semiconductor dynamic random access memory cell is implemented by the series circuit of the n-channel enhancement type switching transistor SW2 and the stacked type storage capacitor CP2.

The storage capacitor CP2 is covered with a second inter-level insulating layer 30, and a bit line BL is patterned on the second inter-level insulating layer 30. The bit line BL is coupled through a contact hole (not shown) to the n-type drain region 23b, and a data bit DB is transferred from the bit line BL through the n-channel enhancement type switching transistor SW2 to the accumulating electrode 27. The two logic levels of the stored data bit DB are corresponding to the positive power voltage level Vcc and the ground voltage level in the accumulating electrode 27.

A process sequence for fabricating the semiconductor dynamic random access memory device is hereinbelow described with reference to FIGS. 5A to 5D of the drawings. The process sequence starts with preparation of the p-type silicon substrate 21, and the thick field oxide layer 22 is selectively grown on the major surface of the p-type silicon substrate 21. The thick filed oxide layer 22 defines the active area in the major surface, and the semiconductor dynamic random access memory cell is fabricated on the active area.

The active area is thermally oxidized for growing the gate insulating film 24, and a polysilicon layer is deposited over the entire surface of the structure. The polysilicon layer is patterned into a word line through lithographic techniques, and a part of the word line on the thin gate insulating layer 24 serves as the gate electrode 25. Using the gate electrode 25 as a mask, n-type dopant impurity is ion-implanted into the active area, and the n-type source region 23a and the n-type drain region 23b are formed in the active area in a self-aligned manner with the gate electrode 25.

Figure 5A:
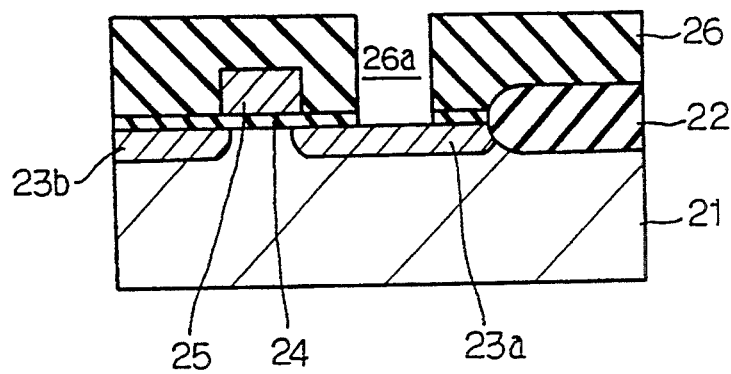
FIGS. 5A to 5D are cross sectional views showing a process sequence for fabricating the semiconductor dynamic random access memory device according to the present invention.

The first inter-level insulating layer 26 is deposited over the entire surface of the structure, and an appropriate mask layer (not shown) is formed on the first inter-level insulating layer 26. The mask layer exposes an area over the n-type source region 23a. Using the mask layer, the inter-level insulating layer 26 and the thin gate oxide film 24 are partially etched away, and a contact hole 26a is formed through the inter-level insulating layer 26 and the thin gate oxide film 24 as shown in FIG. 5A.

Figure 5B:
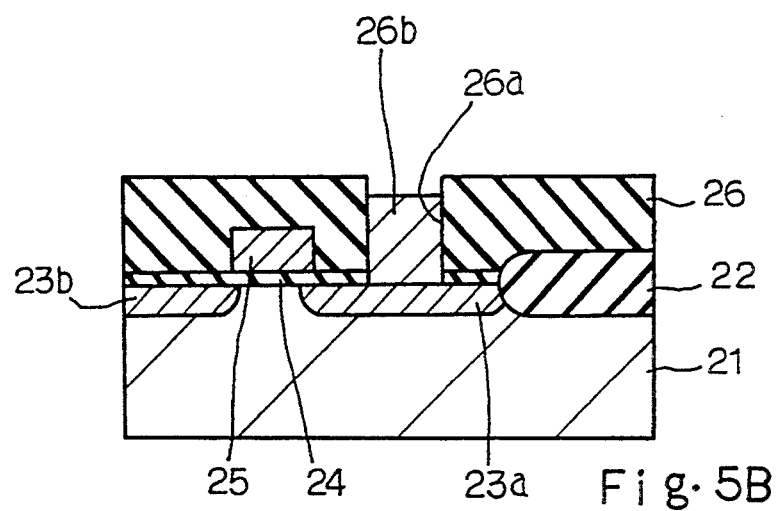

The conductive metal is selectively grown in the contact hole 26a, and the conductive metal block 26b plugs the contact hole 26a. Alternatively, the conductive metal is sputtered on the entire surface of the structure, and the conductive metal film is uniformly etched away so as to leave the conductive metal block in the contact hole 26a. The resultant structure at this stage is illustrated in FIG. 5B.

Figure 5C:
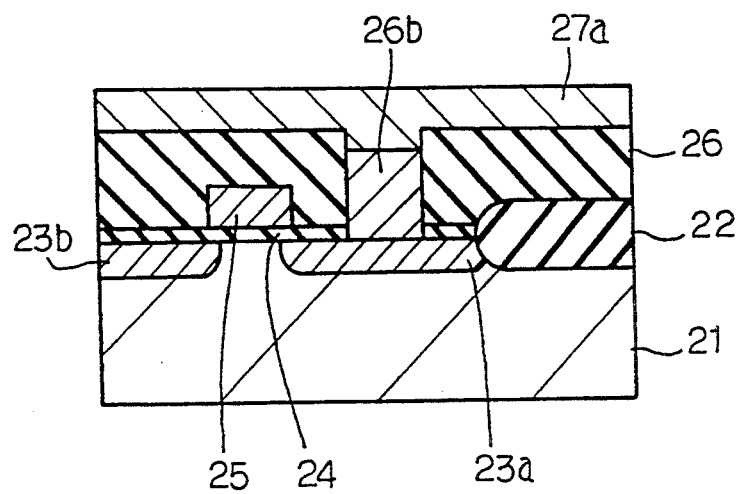

Polysilicon is deposited over the entire surface of the structure, and p-type dopant impurity such as, for example, boron is thermally diffused or ion-implanted into the polysilicon. The polysilicon doped with the p-type dopant impurity forms the p-type polysilicon layer 27a, and is held in contact with the conductive metal block 26b. The resultant structure at this stage is illustrated in FIG. 5C. In this instance, the p-type polysilicon layer 27a is $10^{20}$ atoms/cm$^3$ in dopant concentration.

Figure 5D:
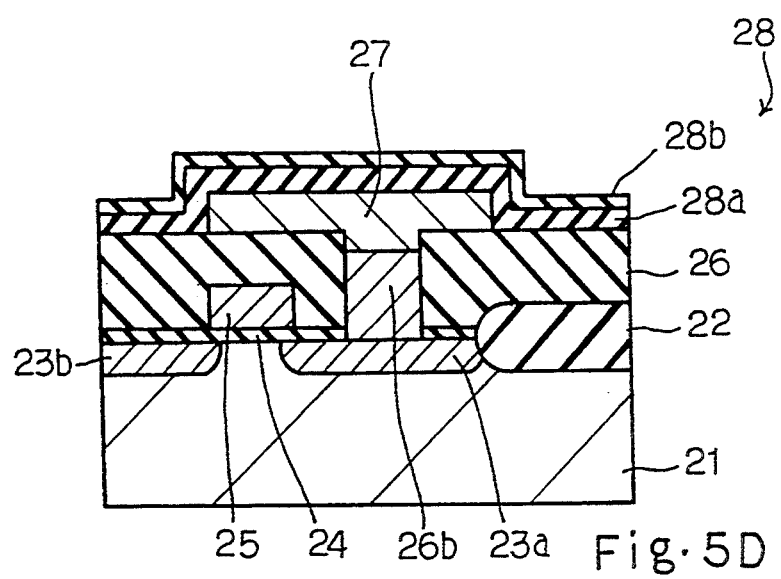

The p-type polysilicon layer 27a is patterned through lithographic techniques into the accumulating electrode 27, and the silicon nitride film 28a is deposited over the entire surface of the structure through a low-pressure chemical vapor deposition. The surface portion of the silicon nitride film 28a is converted into the silicon oxide film 28b through a wet oxidation, and the resultant structure at this stage is illustrated in FIG. 5D. The silicon nitride film 28a and the silicon oxide film 28b form in combination the dielectric film structure 28, and the dielectric film structure 28 is equivalent in thickness to a silicon oxide film less than 5 nanometers thick.

Polysilicon is deposited over the entire surface of the structure though a low-pressure chemical vapor deposition, and p-type dopant impurity is introduced into the deposited polysilicon at $* \times 10^{**}$/cm$^3$. As a result, a p-type doped polysilicon layer is formed on the dielectric film structure 28, and is patterned into the counter electrode 29 by using the lithographic techniques.

The second inter-level insulating layer 30 is deposited over the entire surface of the structure, and a bit contact hole (not shown) is formed through the first and second inter-level layers. The bit line BL is formed on the second inter-level insulating layer 30, and is held in contact through the bit contact hole to the n-type drain region 23b.

Figure 6:
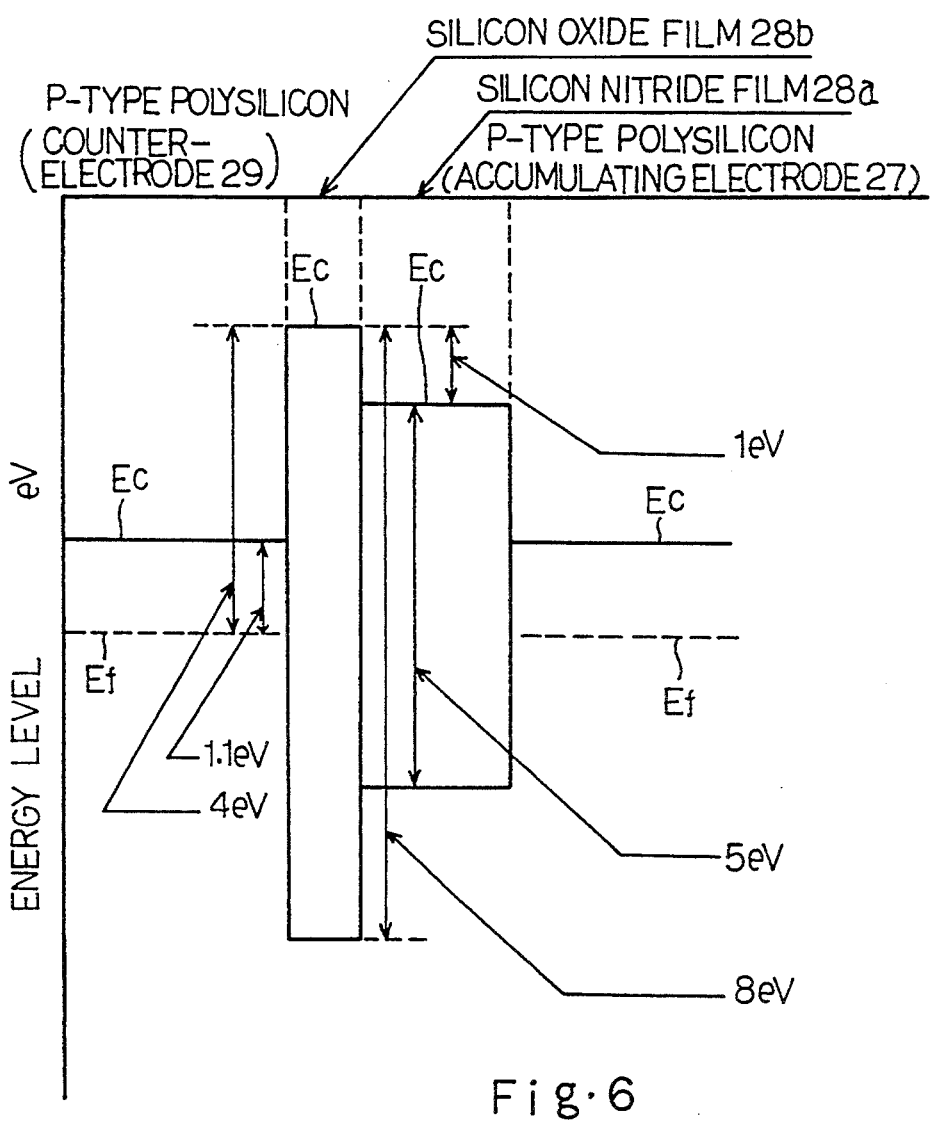
FIG. 6 is an energy band diagram showing the band structure of the stacked type storage capacitor incorporated in the semiconductor dynamic random access memory device in thermal equilibrium.

Turning to FIG. 6 of the drawings, the stacked type storage capacitor CP2 creates an energy structure in thermal equilibrium, and Ec and Ef are representative of the bottom edge of the conduction band and the Fermi level. The silicon oxide and the silicon nitride have an energy band gap about 9 eV and an energy band gap about 5 eV, respectively, and a potential gap about 1 eV is produced between the bottom edge Ec of the silicon oxide and the bottom edge Ec of the silicon nitride.

Since the p-type polysilicon is doped so heavy that the Fermi level Ef of the p-type polysilicon is very close to the top edge of the valence band, and the Fermi level Ef of the p-type polysilicon is spaced from the bottom edge of the conduction band of the silicon oxide by about 1.1 eV. For this reason, the p-type polysilicon and the silicon oxide form a potential gap of about 4 eV between the bottom edge Ec of the silicon oxide and the Fermi level Ef of the p-type polysilicon, and is larger in magnitude than that of the prior art.

Figure 7A:
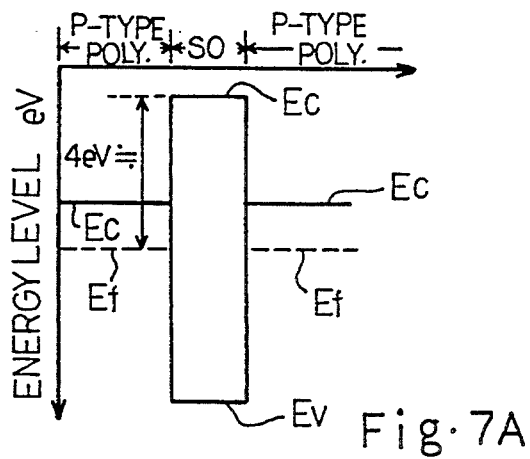
FIGS. 7A to 7C are energy band diagrams showing the band structure of the stacked type storage capacitor under different bias conditions.

The dielectric film structure 28 is equivalent to a silicon oxide film SO with a different thickness, and the energy band structure shown in FIG. 6 is assumed to be equivalent to an energy band structure shown in FIG. 7A. While the accumulating electrode 27 is equal in potential level to the counter electrode 29, the energy band gap about 4 eV provides a potential barrier against carriers.

As described hereinbefore, the counter electrode 29 is biased with the intermediate voltage level Vm about Vcc/2 or 1 volt at all times, and the accumulating electrode 27 is varied in potential level between 0 volt and 2 volts.

Figure 7B:
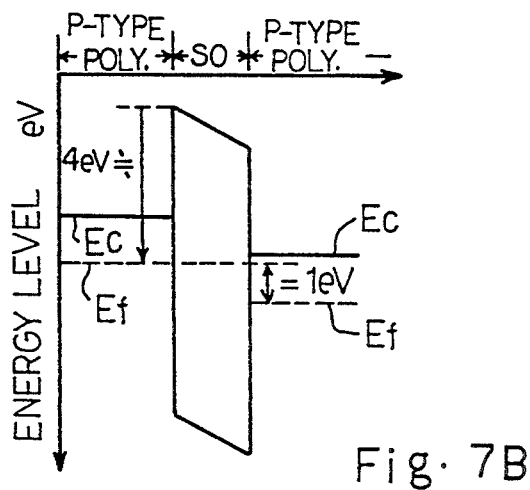

When the accumulating electrode 27 is biased to the counter electrode 29 with 1 volt, the energy structure is modified as shown in FIG. 7B, and the Fermi level of the p-type polysilicon for the counter electrode 29 falls within the forbidden band of the p-type polysilicon for the accumulating electrode 27 as shown in FIG. 7B, because the bias voltage is less than 1.1 volts calculated from the energy gap between the Fermi level of the p-type polysilicon and the bottom edge Ec of the silicon oxide. For this reason, the direct tunneling phenomenon hardly takes place, and direct tunneling current is effectively restricted in the storage capacitor CP2.

Figure 7C:
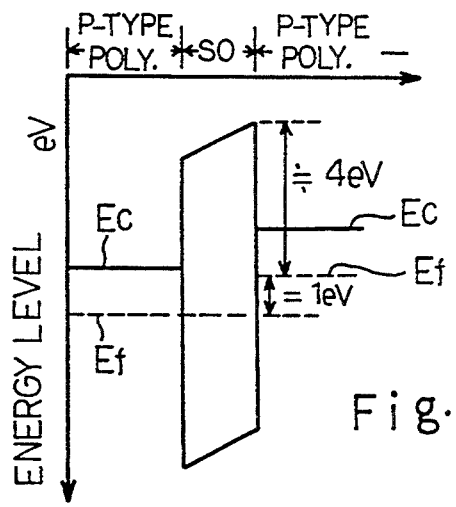

On the other hand, when the accumulating electrode 27 is biased to the counter electrode 29 with $-1$ volt, the energy structure is modified as shown in FIG. 7C, and the Fermi level of the p-type polysilicon for the accumulating electrode 27 falls within the forbidden band of the p-type polysilicon for the counter electrode 29 as shown in FIG. 7C. For this reason, the direct tunneling phenomenon hardly takes place, and direct tunneling current is effectively restricted in the storage capacitor CP2.

The probability P of the direct tunneling is expressed as $$P = \exp[-T(BH)^{\frac{1}{2}}]$$

where T is the thickness of the equivalent dielectric film SO and BH is the potential barrier height. If the equivalent dielectric film SO of the first embodiment is equal in thickness to the equivalent dielectric film of the prior art, the reduction ratio R of the leakage current is calculated as $$R = \exp[-(4)^{\frac{1}{2}}]/\exp[-3(3)^{\frac{1}{2}}] = 0.77$$

If the same leakage current is allowed, the equivalent dielectric film SO is decreased in thickness to $[(3)^{\frac{1}{2}}/(4)^{\frac{1}{2}}] = 0.87$ with respect to the equivalent dielectric film of the prior art.

In this instance, the counter electrode 29 is formed of the p-type polysilicon. However, a lamination of the p-type polysilicon layer and metal layer is available for the counter electrode 29.

As will be understood from the foregoing description, the p-type polysilicon layers causes the Fermi level to fall within the forbidden band under the bias conditions, and the direct tunneling phenomenon hardly takes place. As a result, the dielectric film structure is decreased in thickness, and the storage capacitor CP2 is increased in capacitance without sacrifice of the occupation area.

Second Embodiment

Figure 8:
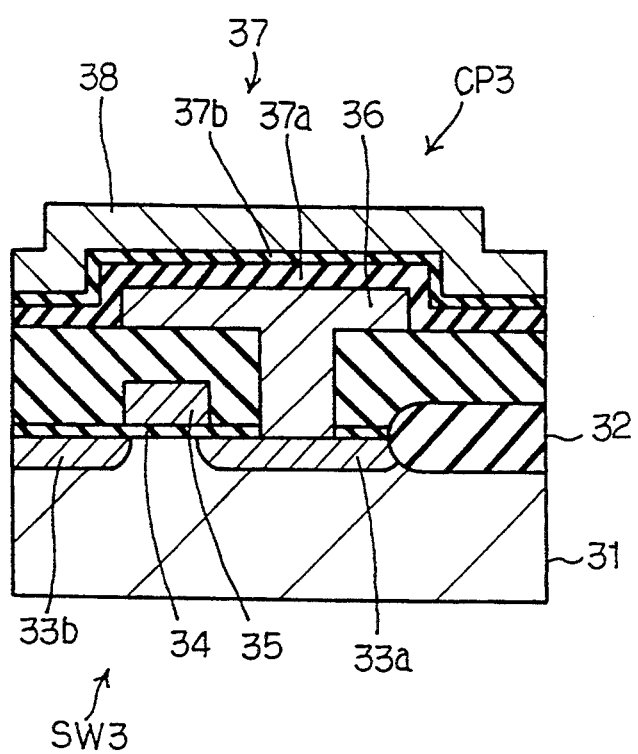
FIG. 8 is a cross sectional view showing the structure of another semiconductor dynamic random access memory cell according to the present invention.

Turning to FIG. 8 of the drawings, another semiconductor dynamic random access memory cell is fabricated on a p-type silicon substrate 31, and largely comprises an n-channel enhancement type switching transistor SW3 and a stacked type storage capacitor CP3 coupled in series. A thick field oxide layer 32 defines an active area assigned to the semiconductor dynamic random access memory cell, and the active area is not wider than the active area assigned to the prior art semiconductor dynamic random access memory cell.

The switching transistor SW3 comprises an n-type source region 33a, an n-type drain region 33b, a gate insulating film 34 and a gate electrode 35 forming a part of a word line. Though not shown in FIG. 8, the n-type drain region 33b is electrically connected with a bit line, and the n-type drain region 33b is electrically connected to and isolated from the n-type source region 33a depending upon the potential level on the word line.

The stacked type storage capacitor CP3 comprises an accumulating electrode 36 of n-type polysilicon with dopant concentration of $* \times 10^{**}$ atoms/cm$^3$, a dielectric film structure 37 covering the accumulating electrode 36 and a counter electrode 38 of p-type polysilicon with dopant concentration of $* \times 10^{**}$ atoms/cm$^3$. The n-type polysilicon forms an ohmic contact between the n-type source region 33a and the accumulating electrode 36, and the dielectric film structure 37 is implemented by the combination of a silicon nitride film 37a and a silicon oxide film 37b. The counter electrode 38 is held in contact with the dielectric film structure 37 in opposing relation to the accumulating electrode 36.

Figure 9A:
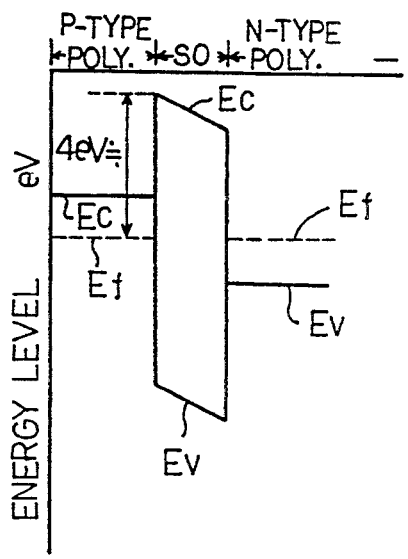
FIGS. 9A to 9C are energy band diagrams showing the band structure of the stacked type storage capacitor incorporated in the semiconductor dynamic random access memory device shown in FIG. 8 under different bias conditions.

The dielectric film structure 37 is equivalent to a silicon oxide film SO different in thickness from the total thickness of the dielectric film structure, and the modified storage capacitor CP3' creates an energy band structure as shown in FIG. 9A in thermal equilibrium. The n-type polysilicon is doped so heavy that the Fermi level is very close to the bottom edge of the conduction band. Similarly, the p-type polysilicon is doped so heavy that the Fermi level is very close to the top edge of the valence band. For this reason, the bottom edge Ec of the conduction band and the top edge of the valence band are deleted from the energy band structure of the n-type polysilicon for the accumulating electrode 36 and the energy band structure of the p-type polysilicon for the counter electrode 38. The potential barrier of about 4 eV is created at the interface between the counter electrode 38 and the equivalent silicon oxide film SO or the dielectric film structure 37.

Figure 9B:
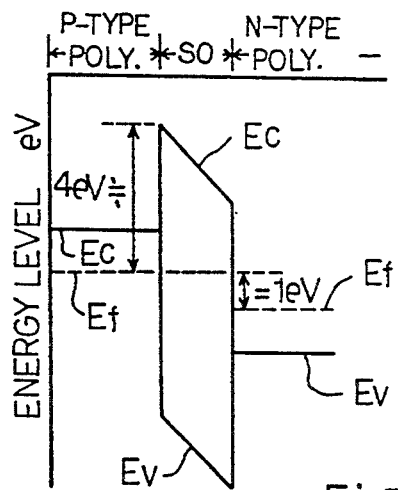

When the accumulating electrode 36 is positively biased to the counter electrode 38 with 1 volt, the energy band structure is changed as shown in FIG. 9B, and the Fermi level Ef of the p-type polysilicon falls within the conduction band of the n-type polysilicon. However, the increased potential barrier about 4 eV decreases the probability P of the direct tunneling, and decreases one of the amount of direct tunneling current and the thickness of the dielectric film structure 37.

Figure 9C:
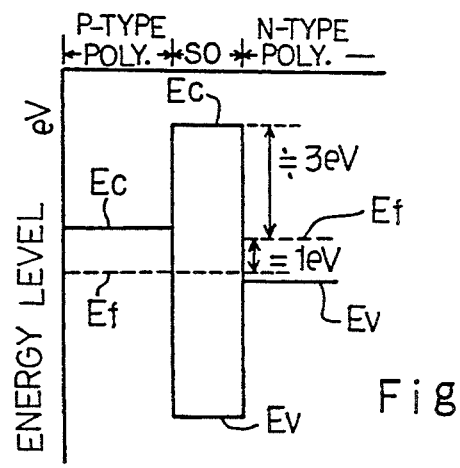

On the other hand, if the accumulating electrode 36 is negatively biased to the counter electrode 38 with $-1$ volt, the energy band structure is changed as shown in FIG. 9C, and the Fermi level Ef of the n-type polysilicon falls within the forbidden band of the p-type polysilicon. For this reason, the direct tunneling hardly takes place.

The dielectric film structure is decreased to 87 per cent of the dielectric film structure of the prior art semiconductor dynamic random access memory device.

Thus, the semiconductor dynamic random access memory device according to the present invention decreases the direct tunneling current without sacrifice of the occupation area. Moreover, the semiconductor dynamic random access memory device is fabricated through a process sequence simpler than that of the first embodiment, because the accumulating electrode 36 is directly held in contact with the n-type drain region 33a without a conductive metal block.

Third Embodiment

Figure 10:
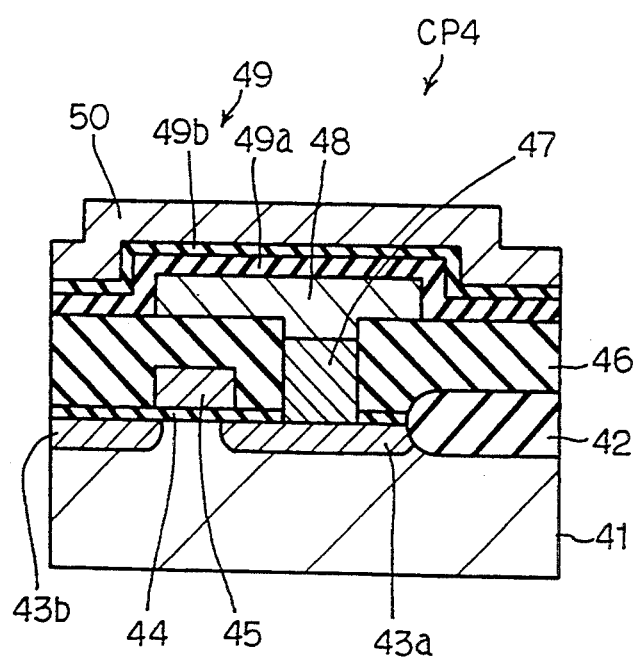
FIG. 10 is a cross sectional view showing the structure of yet another semiconductor dynamic random access memory device according to the present invention.

Turning to FIG. 10 of the drawings, yet another semiconductor dynamic random access memory device embodying the present invention is fabricated on a p-type silicon substrate 41, and largely comprises an n-channel enhancement type switching transistor SW4 and a stacked type storage capacitor CP4 coupled in series. A thick field oxide layer 42 defines an active area assigned to the semiconductor dynamic random access memory cell, and the active area is not wider than the active area assigned to the prior art semiconductor dynamic random access memory cell.

The switching transistor SW4 comprises an n-type source region 43a, an n-type drain region 43b, a gate insulating film 44 and a gate electrode 45 forming a part of a word line. Though not shown in FIG. 10, the n-type drain region 43b is electrically connected with a bit line, and the n-type drain region 43b is electrically connected to and isolated from the n-type source region 43a depending upon the potential level on the word line.

The n-channel enhancement type switching transistor SW4 is covered with an inter-level insulating layer 46, and a contact hole is formed in the inter-level insulating layer 46 for exposing the n-type source region 43a. A conductive metal block 47 plugs the contact hole, and form an ohmic contact with the n-type source region 43a.

The stacked type storage capacitor CP4 comprises an accumulating electrode 48 of p-type polysilicon with dopant concentration of $*\times 10^{**}$ atoms/cm$^3$, a dielectric film structure 49 covering the accumulating electrode 48 and a counter electrode 50 of n-type polysilicon with dopant concentration of $*\times 10^{**}$ atoms/cm$^3$. The p-type polysilicon forms an ohmic contact with the conductive metal block 47, and current bi-directionally flows between the n-type source region 43a and the accumulating electrode 48. The dielectric film structure 49 is implemented by the combination of a silicon nitride film 49a and a silicon oxide film 49b. The counter electrode 50 is held in contact with the dielectric film structure 49 in opposing relation to the accumulating electrode 48.

Figure 11A:
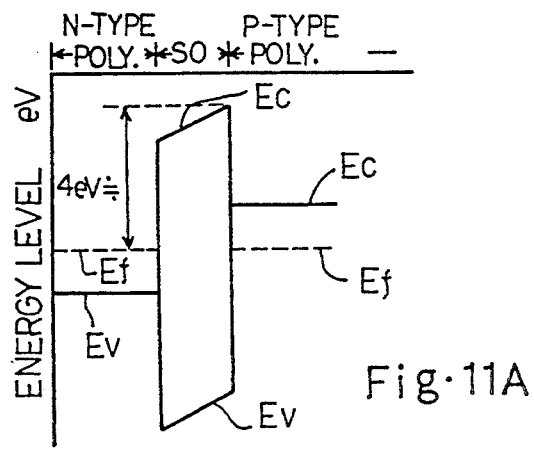
FIGS. 11A to 11C are energy band diagrams showing the band structure of the stacked type storage capacitor incorporated in the semiconductor dynamic random access memory device shown in FIG. 10 under different bias conditions

The dielectric film structure 49 is equivalent to a silicon oxide film SO different in thickness from the total thickness of the dielectric film structure, and the modified storage capacitor CP4' creates an energy band structure as shown in FIG. 11A in thermal equilibrium. The p-type polysilicon is doped so heavy that the Fermi level Ef is very close to the top edge Ev of the conduction band. Similarly, the n-type polysilicon is doped so heavy that the Fermi level Ef is very close to the bottom edge Ec of the conduction band. For this reason, the bottom edge Ec of the conduction band and the top edge of the valence band are deleted from the energy band structure of the n-type polysilicon for the counter electrode 50 and the energy band structure of the p-type polysilicon for the accumulating electrode 48. The potential barrier of about 4 eV is created at the interface between the counter electrode 38 and the equivalent silicon oxide film SO or the dielectric film structure 49.

Figure 11B:
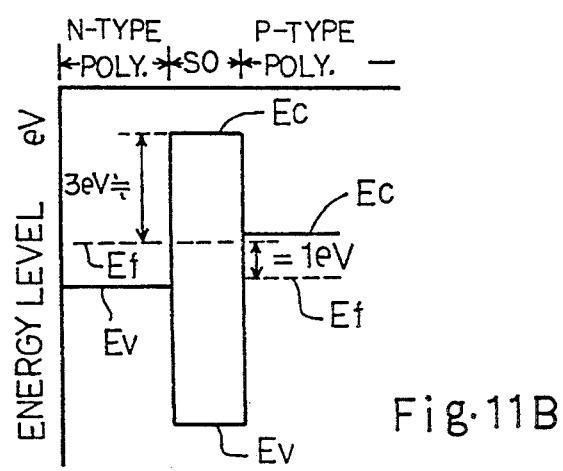

When the accumulating electrode 48 is positively biased to the counter electrode 38 with 1 volt, the energy band structure is changed as shown in FIG. 11B, and the potential barrier is decreased to about 3 eV. However, Fermi level Ef of the n-type polysilicon falls within the forbidden band of the p-type polysilicon. As a result, the direct tunneling phenomenon hardly takes place.

Figure 11C:
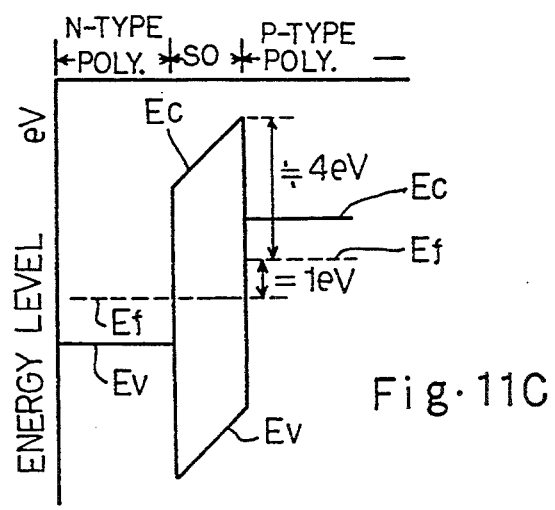

On the other hand, if the accumulating electrode 48 is negatively biased to the counter electrode 50 with −1 volt, the energy band structure is changed as shown in FIG. 11C, and the potential barrier is increased to 4 eV as shown in FIG. 11C. The probability P is decreased, and the dielectric film structure is decreased to 87 per cent of the dielectric film structure of the prior art semiconductor dynamic random access memory device.

Thus, the semiconductor dynamic random access memory device according to the present invention decreases the direct tunneling current without sacrifice of the occupation area.

Although particular embodiments of the present invention have been shown and described, it will be obvious to those skilled in the art that various changes and modifications may be made without departing from the spirit and scope of the present invention.

For example, the impurity regions and the semiconductor layers of the dynamic random access memory cell according to the present invention are changed in the conductivity type from those of the above described embodiments, and the storage capacitor may be a plane type or another three-dimensional type such as, for example, a trench type or a stacked-trench type.

Moreover, the semiconductor dynamic random access memory cell may be incorporated in a function block of a large scale integration.

What is claimed is:

1. A semiconductor dynamic random access memory cell fabricated on a semiconductor substrate, comprising:
    a) a switching transistor having
        a first impurity region formed in a surface portion of said semiconductor substrate and coupled to a signal line, and
        a second impurity region formed in another surface portion of said semiconductor substrate and connectable to said first impurity region; and
    b) a storage capacitor having
        an accumulating electrode electrically connected to said second impurity region in an ohmic manner,
        a dielectric film structure covering said accumulating electrode, and
        a counter electrode held in contact with said dielectric film structure in an opposing relation to said accumulating electrode, at least one of said accumulating electrode and said counter electrode having a p-type polysilicon layer held in contact with said dielectric film structure.

2. The semiconductor dynamic random access memory cell as set forth in claim 1, in which said accumulating electrode and said counter electrode are formed of a p-type polysilicon.

3. The semiconductor dynamic random access memory cell as set forth in claim 2, in which said switching transistor is covered with an inter-level insulating layer with a contact hole open to said second impurity region doped with a donor impurity, a conductive metal block being formed in said contact hole so that said accumulating electrode is electrically connected through said conductive metal block to said second impurity region.

4. The semiconductor dynamic random access memory cell as set forth in claim 3, in which said storage capacitor is a stacked type.

5. The semiconductor dynamic random access memory cell as set forth in claim 1, in which said accumulating electrode and said counter electrode are formed of an n-type polysilicon directly held in contact with said second impurity region doped with a donor impurity and a p-type polysilicon, respectivley.

6. The semiconductor dynamic random access memory cell as set forth in claim 1, in which said switching transistor is covered with an inter-level insulating layer with a contact hole open to said second impurity region doped with a donor impurity, a conductive metal block being formed in said contact hole so that said accumulating electrode of a p-type polysilicon is electrically connected through said conductive metal block to said second impurity region, said counter electrode being formed of an n-type polysilicon.

7. The semiconductor dynamic random access memory cell as set forth in claim 6, in which said storage capacitor is a stacked type.

* * * * *